United States Patent
Iijima et al.

(10) Patent No.: US 12,377,500 B2
(45) Date of Patent: *Aug. 5, 2025

(54) LEAD-FREE AND ANTIMONY-FREE SOLDER ALLOY, SOLDER BALL, AND SOLDER JOINT

(71) Applicant: Senju Metal Industry Co., Ltd., Tokyo (JP)

(72) Inventors: Yuuki Iijima, Tokyo (JP); Shunsaku Yoshikawa, Tokyo (JP); Takashi Saito, Tokyo (JP); Kanta Dei, Tokyo (JP); Takahiro Matsufuji, Tokyo (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 118 days.

This patent is subject to a terminal disclaimer.

(21) Appl. No.: 17/799,575

(22) PCT Filed: Feb. 8, 2021

(86) PCT No.: PCT/JP2021/004571
§ 371 (c)(1),
(2) Date: Aug. 12, 2022

(87) PCT Pub. No.: WO2021/161954
PCT Pub. Date: Aug. 19, 2021

(65) Prior Publication Data
US 2023/0068294 A1    Mar. 2, 2023

(30) Foreign Application Priority Data
Feb. 14, 2020    (JP) ................................. 2020-023277

(51) Int. Cl.
| | | |
|---|---|---|
| B23K 35/00 | (2006.01) |
| B23K 35/02 | (2006.01) |
| B23K 35/26 | (2006.01) |
| C22C 13/00 | (2006.01) |
| C22C 13/02 | (2006.01) |

(52) U.S. Cl.
CPC ........ B23K 35/262 (2013.01); B23K 35/0244 (2013.01); C22C 13/02 (2013.01)

(58) Field of Classification Search
CPC .............. B23K 35/262; B23K 35/0244; B23K 3/0623; C22C 13/02; C22C 13/00; H05K 2203/041; H05K 3/3463; H05K 3/34
USPC ............................ 228/56.3, 180.22, 245–246
See application file for complete search history.

(56) References Cited

U.S. PATENT DOCUMENTS

| | | |
|---|---|---|
| 7,005,106 B2 | 2/2006 | Zumida et al. |
| 9,221,131 B2 | 12/2015 | Ingham et al. |
| 10,322,471 B2 | 6/2019 | Choudhury et al. |
| 2002/0051728 A1 | 5/2002 | Sato et al. |
| 2014/0328719 A1 | 11/2014 | Chen |
| 2016/0368102 A1 | 12/2016 | Nishimura et al. |
| 2018/0102464 A1* | 4/2018 | de Avila Ribas .... B23K 35/262 |
| 2019/0157535 A1* | 5/2019 | de Avila Ribas ....... H01L 24/32 |
| 2020/0070287 A1* | 3/2020 | Mutuku ............... B23K 35/025 |
| 2020/0140975 A1 | 5/2020 | Nishimura et al. |
| 2021/0207246 A1* | 7/2021 | Chang ..................... C22C 13/00 |
| 2021/0339344 A1* | 11/2021 | Zhang .................. B23K 35/025 |
| 2022/0080535 A1* | 3/2022 | Hasnine ................. B23K 35/26 |
| 2022/0324061 A1 | 10/2022 | Iijima et al. |

FOREIGN PATENT DOCUMENTS

| | | | | |
|---|---|---|---|---|
| EP | 3715039 B1 * | 8/2021 | ......... | B23K 35/0222 |
| EP | 3903993 A1 * | 11/2021 | ......... | B23K 35/0222 |
| JP | 200220807 A | 1/2002 | | |
| JP | 3649384 B2 * | 5/2005 | | |
| JP | 4144415 B2 | 6/2008 | | |
| JP | 5147409 B2 | 12/2012 | | |
| JP | 2014217888 A | 11/2014 | | |
| JP | 201823987 A | 2/2018 | | |
| JP | 201858090 A | 4/2018 | | |
| JP | 2019155467 A | 9/2019 | | |
| JP | 6700568 B1 * | 5/2020 | ......... | B23K 35/0222 |
| JP | 6912742 B1 * | 8/2021 | ......... | B23K 35/0244 |
| KR | 1020040028695 A | 4/2004 | | |
| KR | 102460042 B1 * | 10/2022 | | |
| TW | 201615854 A | 5/2016 | | |
| TW | 202024345 A * | 7/2020 | ............. | B23K 35/02 |
| WO | WO-2014057261 A1 * | 4/2014 | ............... | B23K 1/00 |
| WO | WO-2016012754 A2 * | 1/2016 | ........... | B23K 1/0016 |
| WO | 2018174162 A1 | 9/2018 | | |
| WO | WO-2020135932 A1 * | 7/2020 | ........... | B23K 35/262 |
| WO | 2021029222 A1 | 2/2021 | | |
| WO | WO-2021043437 A1 * | 3/2021 | ......... | B23K 35/0227 |
| WO | WO-2022107806 A1 * | 5/2022 | ......... | B23K 35/0244 |

OTHER PUBLICATIONS

Machine translation of JP2019155467 (No. date available).*
Office Action in U.S. Appl. No. 17/633,608, dated Nov. 7, 2024.

* cited by examiner

Primary Examiner — Kiley S Stoner
(74) Attorney, Agent, or Firm — The Webb Law Firm

(57) ABSTRACT

Provided are a lead-free and antimony-free solder alloy, a solder ball, and a solder joint that have improved shear strength obtained by grain minuteness at a bonded interface and can suppress fusion failure. The lead-free and antimony-free solder alloy having an alloy composition consisting of, by mass %, 0.1 to 4.5% of Ag, 0.20 to 0.85% of Cu, 0.2 to 5.00% of Bi, 0.005 to 0.09% of Ni, and 0.0005 to 0.0090% of Ge with the balance being Sn, and the alloy composition satisfies the following relations (1) and (2): $0.013 \leq (Ag+Cu+Ni+Bi) \times Ge \leq 0.027$ (1), $Sn \times Cu \times Ni \leq 5.0$ (2). Ag, Cu, Ni, Bi, Ge, and Sn in the relations (1) and (2) each represent the contents (mass %) in the alloy composition.

10 Claims, No Drawings

LEAD-FREE AND ANTIMONY-FREE SOLDER ALLOY, SOLDER BALL, AND SOLDER JOINT

CROSS-REFERENCE TO RELATED APPLICATIONS

This application is the United States national phase of International Application No. PCT/JP2021/004571 filed Feb. 8, 2021, and claims priority to Japanese Patent Application No. 2020-023277 filed Feb. 14, 2020, the disclosures of which are hereby incorporated by reference in their entirety.

BACKGROUND

Field

The present invention relates to a lead-free and antimony-free solder alloy, a solder ball, and a solder joint.

Description of Related Art

In recent years, electronic devices are required to have higher integration, larger capacity, and higher speed. For example, a semiconductor package such as QFP (Quad Flat Package) is used, and high integration and high functionality at the semiconductor chip level are being pursued. In manufacture of QFP, a packaging process of die bonding a silicon chip cut from a silicon wafer to a lead frame is employed.

In QFP, which is obtained by bonding microelectrodes such as BGA (Ball Grid Array), a solder joint is formed by die bonding the silicon chip and the lead frame with a solder alloy. A back metal, for example, having a Ni layer as the outermost layer is formed on the silicon chip, in order to improve the wettability with the solder and improve the adhesive strength. However, when the Ni layer being the outermost layer is in contact with molten solder, the Ni layer melts into the molten solder and Ni leaching occurs. Here, a barrier layer such as Ti is usually formed on the back metal to suppress Ni from diffusing into the silicon chip. When Ni leaching progresses and the Ti layer is exposed, the back metal repels the molten solder without wetting, because the wettability of the solder alloy to Ti is very poor. Moreover, even if a little of the Ni layer remains, Ni atoms diffuse into the molten solder and Ti hardly diffuses into the Ni. Therefore, the number of voids increases at the atomic level at an interface between the Ti layer as the barrier layer and the Ni layer, and the adhesive strength at the interface between the little remaining Ni layer and the Ti layer is extremely reduced. As a result, the bonded section after die bonding may be inferior in impact resistance and heat cycle resistance. Thus, retaining the Ni layer of the back metal is extremely important in die bonding.

Further, in a microelectrode such as BGA, solder bumps are formed by using solder balls. When solder balls are used, adhesive flux is applied to the microelectrode and solder balls are placed on the electrode coated with flux. After that, the solder balls are melted by heating in a reflow furnace, and the molten solder wets the microelectrode, so that solder bumps are formed on the microelectrodes. Thus, when solder balls are used, wettability with the electrode is required.

Conventionally, Sn—Ag—Cu solder alloys have been widely used, and are used in the form of solder balls as well as for die bonding. However, when this solder alloy is used, it may be necessary to improve heat cycle resistance, impact resistance, and discoloration resistance among various requirements in recent years. Therefore, in order to improve these characteristics, various studies have been made on Sn—Ag—Cu solder alloys that have been widely used conventionally.

For example, Patent Document 1 discloses an Sn—Ag—Cu solder alloy containing Ni as an optional element as well as Ge and the like as a selective essential element. It is disclosed that this solder alloy exhibits heat cycle resistance when it contains Ni, and exhibits impact resistance and/or discoloration resistance when it contains Ge.

Patent Document 1: Japanese Patent No. 4144415 B2

SUMMARY

As described above, the solder alloy disclosed in Patent Document 1 is an excellent alloy that can simultaneously achieve the three kinds of effects, i.e. impact resistance, discoloration resistance, and heat cycle resistance. However, there seems to be room for further improvement with regard to alloy design.

Although each element has its specific significance to be added to the solder alloy, since a solder alloy is an integrated object formed by combination of all constituent elements and the constituent elements influence each other, the constituent elements need to be contained in a well-balanced manner as a whole. For the solder alloy as described in Patent Document 1, it seems that the contents of each constituent element are individually optimized, and are sufficient for obtaining the effects as described in Patent Document 1 at the time of filing the Patent Document 1. However, in order to make a solder alloy containing the same constituent elements adapt to recent demands, it is necessary to individually optimize the content of each constituent element such that each property can be simultaneously improved, and further, the constituent elements need to be contained in a well-balanced manner.

In the invention described in Patent Document 1, an alloy design is conducted on the assumption that a solder ball is placed on a microelectrode such as BGA. In addition, even when the solder alloy disclosed in Patent Document 1 is used for die bonding with a large bonding area, breakage due to external stress cannot be ignored. Therefore, when soldering is performed by using an Sn—Ag—Cu—Ni—Ge solder alloy, improvement in shear strength is required. Furthermore, paste applied to an electrode on a substrate and the solder ball on the BGA may not be commingled during melting, so that fusion failure may occur in which a boundary between the paste and the solder ball remains. This is a serious bonding defect and therefore must be suppressed.

As described above, due to recent higher integration, larger capacity, and higher speed of electronic devices, a solder alloy that can be applied not only to BGA but also to die bonding used in QFP has been required.

An objective of the present invention is to provide a lead-free and antimony-free solder alloy, a solder ball, and a solder joint that have improved shear strength obtained by grain minuteness at a bonded interface and can suppress fusion failure.

A solder alloy is composed of two or more kinds of elements, and the effects of these element kinds may individually affect the properties of the entire solder alloy. However, as described above, because all the constituent elements constitute an integrated object, the constituent elements are related to each other. The present inventors have focused on alloy design by which shear strength is improved and fusion failure is suppressed so that the alloy design can be applied not only to BGA but also to QFP even for the same constituent elements as the solder alloy according to Patent Document 1. Specifically, under reconsideration of the significance of adding each of the constituent elements, the present inventors conducted a detailed search for composition under consideration of the balance of each of the constituent elements.

Further, conventionally, in a case where Pb is used for a substrate and then landfilled, acid rain may cause Pb to elute and flow into groundwater. Then, it may affect the human body by accumulating in livestock and humans from groundwater. Therefore, Pb is designated as a regulated substance by the RoHS Directive. Furthermore, in recent years, for environmental and health reasons, there has been a growing demand to avoid the use of not only Pb but also Sb that may improve the heat-cycling properties of Sn-based solder alloys. Thus, alloy compositions have been studied to achieve the desired properties in a lead-free and antimony-free condition.

First, the present inventors have conducted a study on fusion failure that should not occur in soldering. The occurrence of the fusion failure is attributed to a state of the solder ball on the side of BGA and the paste on the side of the substrate. If a thick Sn oxide film is formed on at least one of the solder ball and the paste, solder alloys thereof will poorly commingle with each other during melting, and a boundary between the solder ball and the paste is thus formed after cooling. One means of removing the oxide film on each surface may be to use flux. Even if the flux is used, however, it is difficult to completely remove the oxide film, and the wettability deteriorates due to the remaining oxide film.

However, even though the paste contains flux, it is difficult to both remove the oxide film and improve the wettability. In addition, since the volume of the solder ball is several times larger than that of solder powder used for the paste, it is more reasonable to solve the problem of fusion failure on the side of the solder ball than on the side of the paste.

A study was conducted to suppress the occurrence of fusion failure in the alloy composition on the side of the solder ball. In the Sn—Ag—Cu—Bi—Ni—Ge solder alloy, in order to suppress generation of an Sn oxide film on the surface thereof, it is necessary to appropriately adjust the Ge content to an optimum range. Ge is common as an element that incorporates oxygen in the atmosphere to form germanium oxide. Germanium oxide is formed as a hard and brittle oxide film on the surface of the molten solder. However, this oxide film is easily destroyed by the convection of the molten solder itself and also by the external pressure applied to the molten solder at the time when the chip is placed on the molten solder. Therefore, the fusion of the solder ball and the solder powder in the paste will not be disturbed. In addition, if a total content of Ag, Cu, Bi, and Ni is appropriate, $\Delta T$ is in an appropriate range. Furthermore, the solder powder for the paste is fused with the solder ball on BGA by adjusting the viscosity of the molten solder.

In view of these, detailed research has been conducted on the fact that the fusion is attributed to the balance between a total content of Ag, Cu, Bi, and Ni and Ge content in the Sn—Ag—Cu—Bi—Ni—Ge solder alloy. As a result, it was found that fusion failure does not occur when these balances are within a predetermined range.

The present inventors also studied minuteness of intermetallic compounds formed at a bonded interface to prevent the occurrence of fusion failure and to improve the bonding strength of the solder joint. In order to form a compound of Cu and Sn formed at the bonded interface, the content ratio of Cu and Sn needs to be within a predetermined range. In addition, in the compound of Cu and Sn, the minuteness of the compound is achieved by replacing a part of Cu with Ni. Furthermore, since the liquidus temperature of the solder alloy fluctuates greatly depending on the contents of Cu and Ni, the viscosity during melting was controlled in a way that $\Delta T$ did not become too large, and a study was conducted to suppress the growth of the Sn compound. As a result, it was also found that in the Sn—Ag—Cu—Bi—Ni—Ge solder alloy, $\Delta T$ is controlled to make intermetallic compounds formed at a bonded interface minute by containing Sn, Cu, and Ni contents in a well-balanced manner, so that the shear strength is improved.

As a result of the keen study conducted focusing on the above, it was found that Ni leaching is suppressed by adding Bi to the Sn—Ag—Cu—Ni—Ge solder alloy. Then, it was found that the total content of Ag, Cu, Bi, and Ni and the Ge content can satisfy the suppression of fusion failure at the same time by satisfying the prescribed relationship, as described above. Furthermore, it was also found that if Sn, Cu, and Ni are mixed in a well-balanced manner, shear strength is improved.

The present invention obtained from these finding is as follows.

(1) A lead-free and antimony-free solder alloy having an alloy composition consisting of, by mass %, 0.1 to 4.5% of Ag, 0.20 to 0.85% of Cu, 0.2 to 5.00% of Bi, 0.005 to 0.09% of Ni, and 0.0005 to 0.0090% of Ge with the balance being Sn, wherein the alloy composition satisfies the following relations (1) and (2):

$$0.013 \leq (Ag+Cu+Ni+Bi) \times Ge \leq 0.027 \quad \text{Relation (1)}$$

$$Sn \times Cu \times Ni \leq 5.0 \quad \text{Relation (2)}$$

wherein Ag, Cu, Ni, Bi, Ge, and Sn in the relations (1) and (2) each represent the contents (mass %) in the alloy composition.

(2) The lead-free and antimony-free solder alloy according to (1) above, wherein, by mass %, the alloy composition contains 0.0005 to 0.0045% of Ge.

(3) The lead-free and antimony-free solder alloy according to any one of (1) or (2) above, wherein the alloy composition contains one or more selected from the group consisting of Mn, Pd, P, Au, Pt, Cr, Fe, Co, V, Mo, and Nb each with an upper limit of 0.01% by mass %.

(4) A solder ball comprising the lead-free and antimony-free solder alloy according to any one of (1) to (3) above.

(5) The solder ball according to (4) above, having an average particle diameter of 1 to 1000 μm.

(6) The solder ball according to (4) or (5) above, having a sphericity of 0.95 or more.

(7) The solder ball according to (4) or (5) above, having a sphericity of 0.99 or more.

(8) A ball grid array formed using the solder ball according to any one of (4) to (7) above.

(9) A solder joint comprising the lead-free and antimony-free solder alloy according to any one of (1) to (3) above.

DESCRIPTION OF EMBODIMENTS

The present invention is described in more detail below. In the present description, "%" relating to the solder alloy composition refers to "mass %" unless otherwise specified.

1. Alloy Composition (1) 0.1 to 4.5% of Ag

Ag is an element that improves the strength of the solder alloy by precipitating minute $Ag_3Sn$ at the grain boundaries. If the Ag content is less than 0.1%, the effect of adding Ag is not sufficiently exhibited. In terms of the lower limit, the Ag content is 0.1% or more, preferably 0.5% or more, more preferably 1.0% or more, even more preferably 2.0% or more, particularly preferably 2.8% or more, and most preferably 3.0% or more. On the other hand, if the Ag content is too large, coarse $Ag_3Sn$ is precipitated, whereby the strength deteriorates. In terms of the upper limit, the Ag content is 4.5% or less, preferably 4.0% or less, more preferably 3.8% or less, even more preferably 3.5% or less, and most preferably 3.2% or less.

(2) 0.20 to 0.85% of Cu

Cu is an element that can suppress Cu leaching and enable precipitation strengthening by $Cu_6Sn_5$. If the Cu content is less than 0.20%, since the precipitated amount of $Cu_6Sn_5$ is small and a brittle SnNi compound is precipitated, the solder alloy itself becomes brittle. In terms of the lower limit, the Cu content is 0.20% or more, preferably 0.3% or more, more preferably 0.4% or more, even more preferably 0.5% or more, even yet more preferably 0.6% or more, particularly preferably 0.7% or more, and most preferably 0.75% or more. On the other hand, if the Cu content is more than 0.85%, the liquidus temperature of the solder alloy is high and the solder alloy is difficult to melt. In terms of the upper limit, the Cu content is 0.85% or less, preferably 0.80% or less.

(3) 0.2 to 5.00% of Bi

Bi is an essential element in the solder alloy according to the present invention because the optimum mechanical properties can be obtained for the form of the solder ball used as BGA by adding a predetermined amount of Bi. Bi improves mechanical properties by solid-solution strengthening, and creep resistance and wettability can also be improved. Furthermore, because Bi dissolves in Sn, the crystal structure of $(Cu,Ni)_6Sn_5$ is distorted, and by coexisting with Ge, Ni leaching can be further suppressed. Bi needs to be contained at 0.2% or more, preferably 0.3% or more, more preferably 0.5% or more, further preferably 1.0% or more, particularly preferably 1.4% or more, and most preferably 1.5% or more.

On the other hand, if Bi is excessively added, the drop resistance may deteriorate. Furthermore, because the solidus temperature is lowered while the liquidus temperature hardly changes, $\Delta T$, which is defined as a difference between a liquidus temperature and a solidus temperature, becomes large. If $\Delta T$ becomes too large, segregation will occur during solidification, leading to deterioration of mechanical properties such as mechanical strength. Therefore, in terms of the upper limit, the Bi content is 5.00% or less, preferably 4.0% or less, more preferably 3.5% or less, further preferably 3.0% or less, particularly preferably 2.5% or less, and most preferably 2.0% or less.

(4) 0.005 to 0.090% of Ni

Ni is an element that can control a liquidus temperature of the solder alloy and suppress Ni leaching similarly to Cu. If the Ni content is less than 0.005%, the effect of adding Ni is difficult to exhibit. In terms of the lower limit, the Ni content is 0.005% or more, preferably 0.01% or more, more preferably 0.02% or more, 0.03% or more, and particularly preferably 0.04% or more. On the other hand, if the Ni content is more than 0.090%, the liquidus temperature of the solder alloy is high and the solder alloy is difficult to melt. In terms of the upper limit, the Ni content is 0.090% or less, preferably 0.080% or less, more preferably 0.070% or less, even more preferably 0.068% or less, particularly preferably 0.060% or less, and most preferably 0.050% or less.

(5) 0.0005 to 0.0090% of Ge

Ge is an element that can suppress fusion failure and Ni leaching. When Ge is not contained, tin oxide is formed on the surface of the molten solder. Tin oxide is strong and hard to break. On the other hand, Ge added to the solder alloy reacts with O in the atmosphere to form a hard and brittle oxide film on the surface of the molten solder. Because this oxide film is brittle, it is easily destroyed by the convection of the molten solder itself or the external force applied from the chip at the time when the chip is placed. Therefore, the formation of the oxide film of Sn is inhibited, and the oxide film is not retained on the surface of the molten solder. Contrary to the oxide film of Sn, the fusion of the solder ball and the solder powder in the paste is promoted.

In addition, Ge is an element that can be dissolved in Ni of $(Cu,Ni)_6Sn_5$ formed at the bonded interface to suppress Ni leaching. Because $(Cu,Ni)_6Sn_5$ is formed at the bonded interface, the crystal structure of this compound is distorted by Ge, so that the migration of Ni in the compound is suppressed and the migration of Ni to the solder alloy is inhibited. When Ge is not contained, the crystal structure of $(Cu,Ni)_6Sn_5$ is maintained in an aligned state, then Ni at the bonded interface diffuses into the solder alloy, and Ni leaching occurs.

When the Ge content is less than 0.0005%, tin oxide is produced, the crystal structure of $(Cu,Ni)_6Sn_5$ is not distorted, and the above effect is difficult to be exhibited. In terms of the lower limit, the Ge content is 0.0005% or more, preferably 0.0020% or more, more preferably 0.0030% or more, and even more preferably 0.0035% or more. On the other hand, if the Ge content is too large, the liquidus temperature is high and difficult to melt. In terms of the upper limit, the Ge content is 0.0090% or less, preferably 0.0080% or less, more preferably 0.0060% or less, even more preferably 0.0050% or less, particularly preferably 0.0045% or less, and most preferably 0.0040% or less.

(6) Comprising One or More Selected from the Group Consisting of Mn, Pd, P, Au, Pt, Cr, Fe, Co, V, Mo, and Nb Each with an Upper Limit of 0.01%

The solder alloy according to the present invention can comprise one or more selected from Mn, Pd, P, Au, Pt, Cr, Fe, Co, V, Mo, and Nb, each with an upper limit of 0.01% as an optional element. These elements can improve mechanical properties.

(7) Balance: Sn

The balance of the solder alloy according to the present invention is Sn. In addition to the above-described elements, unavoidable impurities may be contained. Even if unavoidable impurities are contained, it does not affect the above-mentioned effects. Specific examples of the unavoidable impurities include As and Cd. Furthermore, although the present invention is lead-free and antimony-free, it does not exclude the inclusion of Pb and Sb as unavoidable impurities. If In is contained, the wettability deteriorates, and it is better not to contain In. Furthermore, Mn does not have to be contained because it is oxidized during the production of the solder alloy and it is difficult to produce the solder alloy.

(8) Relation (1)

The present invention satisfies the following relation (1):

$$0.004 < (Ag+Cu+Ni+Bi) \times Ge < 0.032 \qquad \text{Relation (1)}$$

In the above relation (1), Ag, Cu, Ni, Bi, and Ge each represent the contents (mass %) in the alloy composition.

If the relation (1) is satisfied, fusion failure is suppressed. In the Sn—Ag—Cu—Bi—Ni—Ge solder alloy, as described above, Ge incorporates oxygen in the atmosphere to form a hard and brittle germanium oxide. This oxide film is easily destroyed by the convection of the molten solder itself and also by the external pressure applied to the molten solder at the time when the chip is placed on the molten solder. Therefore, the formation of the oxide film of Sn is inhibited, and the oxide film is not retained on the surface of the molten solder. Contrary to the oxide film of Sn, the fusion of the solder ball and the solder powder in the paste is promoted. In addition, if the total content of Ag, Cu, Bi, and Ni is too large, $\Delta T$ increases. Furthermore, if the viscosity of the molten solder is too high, the fusion of the solder powder for the paste and the solder ball on BGA is impaired. On the other hand, if the total content of Ag, Cu, Bi, and Ni is small, fusion failure occurs because the Ge content becomes relatively large and the hard and brittle Ge oxide will be thickly formed.

In view of these, detailed research has been conducted on the fact that the fusion is attributed to the balance between the total content of Ag, Cu, Bi, and Ni and Ge content in the Sn—Ag—Cu—Bi—Ni—Ge solder alloy. As a result, it was found that fusion failure does not occur when these balances are within a predetermined range.

In terms of the lower limit, the relation (1) needs to be more than 0.004 and is preferably 0.013 or more, more preferably 0.015 or more, even more preferably 0.018 or more, even yet more preferably 0.019 or more, particularly preferably 0.020 or more, and most preferably 0.021 or more. In terms of the upper limit, the relation (1) needs to be less than 0.032 and is preferably 0.031 or less, more preferably 0.030 or less, even more preferably 0.029 or less, even yet more preferably 0.027 or less, particularly preferably 0.026 or less, and most preferably 0.025 or less, and may be 0.024 or less and 0.023 or less.

(9) Relation (2)

The present invention satisfies the following relation (2):

$$Sn \times Cu \times Ni \leq 5.0 \quad \text{Relation (2)}$$

In the above relation (2), Sn, Cu, and Ni each represent the contents (mass %) in the alloy composition.

For the solder alloy according to the present invention, in the compound of Cu and Sn, the minuteness of the compound is achieved by replacing a part of Cu with Ni in order to improve bonding strength of solder joints. In addition, if these elements are mixed in a well-balanced manner, the viscosity during melting is controlled in a way that $\Delta T$ does not become too large, so that the growth of the Sn compound can be suppressed. As a result, it is presumed that in the Sn—Ag—Cu—Bi—Ni—Ge solder alloy, $\Delta T$ is controlled to make intermetallic compounds formed at a bonded interface minute by containing Sn, Cu, and Ni contents in a well-balanced manner, so that the shear strength is improved.

In terms of the upper limit, the relation (2) is 5.0 or less, preferably 4.9 or less, more preferably 4.5 or less, even more preferably 4.0 or less, even yet more preferably 3.8 or less, particularly preferably 3.7 or less, and most preferably 3.6 or less, and may be 3.3 or less and 3.2 or less. In terms of the lower limit, the relation (2) is not particularly limited, but from the viewpoint of suppressing Ni leaching and sufficiently improving shear strength, it is preferably 0.7 or more, more preferably 1.0 or more, even more preferably 1.3 or more, even yet more preferably 1.4 or more, particularly preferably 1.5 or more, and most preferably 1.6 or more, and may be 2.3 or more and 2.9 or more.

Consequently, the solder alloy according to the present invention needs to satisfy the relations (1) and (2) in order to achieve both suppression of fusion failure and improvement in shear strength. As a result thereof, Ni leaching can also be suppressed.

(10) $\Delta T$

It is preferable that $\Delta T$ of the solder alloy according to the present invention is within a predetermined range because the solid-liquid coexistence region is narrow, and for example, an increase in the viscosity of the molten solder can be suppressed. The range of $\Delta T$ is preferably 100° C. or less, more preferably 70° C. or less, and even more preferably 40° C. or less.

3. Solder Ball

The lead-free and antimony-free solder alloy according to the present invention is most suitable for the form of solder balls used for BGA. The sphericity of the solder ball is preferably 0.90 or more, more preferably 0.95 or more, and most preferably 0.99 or more. The sphericity is determined by various methods such as the least squares circle method (LSC method), the minimum zone circle method (MZC method), the maximum inscribed circle method (MIC method), and the minimum circumscribed circle method (MCC method). In the present invention, the sphericity of the solder ball is measured using a CNC image measuring system (Ultra Quick Vision ULTRA QV350-PRO measuring device manufactured by Mitutoyo Corporation) using the minimum zone circle method (MZC method). In the present invention, the sphericity represents a deviation from the true sphere, and for example, the sphericity is an arithmetic mean value calculated when the diameter of each of 500 balls is divided by the major axis. The closer the value of the sphericity is to the upper limit of 1.00, the closer it is to a true sphere.

The solder balls according to the present invention are used for forming bumps on electrodes and substrates of semiconductor packages such as BGA (ball grid array). The diameter of the solder ball according to the present invention is preferably in the range of 1 to 1000 μm and more preferably 50 m or more to 300 m. The solder ball can be manufactured by a general solder ball manufacturing method. The diameter in the present invention means the diameter measured by Ultra Quick Vision ULTRA QV350-PRO measuring device manufactured by Mitutoyo Corporation.

4. Solder Joint

The solder joint according to the present invention is suitable for connection between an IC chip for a semiconductor package and its substrate (interposer), or for connection between the semiconductor package and a printed wiring board. Here, the term "solder joint" according to the present invention is defined as a connection part between an IC chip and a substrate, which is connected using the above-described solder alloy according to the present invention, and the connection part includes a connection for an electrode or a connection part between a die and the substrate.

5. Other

A bonding method using a solder alloy according to the present invention may be performed according to an ordinary method e.g. using a reflow method. The heating temperature may be appropriately adjusted depending on the heat resistance of the chip or the liquidus temperature of the solder alloy. About 240° C. is preferable as the heating temperature from the viewpoint of suppressing thermal damage to the chip. A melting temperature of the solder alloy for performing flow soldering may be approximately 20° C. higher than the liquidus temperature. In a case where bonding is conducted by using the solder alloy according to the present invention, the structure can be further made minuteness by considering a cooling rate during solidification. For example, the solder joint is cooled at a cooling rate of 2 to 3° C./s or higher. Other bonding conditions can be appropriately adjusted depending on the alloy composition of the solder alloy.

The solder alloy according to the present invention enables a low α-ray alloy to be produced by using a low α-ray material as a raw material therefor. When such a low α-ray-alloy is used for forming solder bumps in the periphery of memory, soft errors can be suppressed.

EXAMPLES

For the solder alloys constituted from alloy compositions as shown in Table 1, fusion failure and ΔT obtained from the liquidus temperature and the solidus temperature were evaluated as follows. The shear strength and Ni leaching were also evaluated.

(1) Presence or Absence of Fusion Failure

The solder alloys as shown in Table 1 were verified for the presence or absence of fusion failure. A method for verifying them was such that the prepared solder alloys based on compositions of Examples and Comparative Examples were cast and rolled, and they were punched out into small piece members (each being 2 mm (length)×2 mm (width)×0.1 mm (thickness)). These small pieces were formed as plate materials having a predetermined dimension, which were put on a Cu plate on which organic solderability preservative (OSP) processing (water-soluble preflux processing) was performed and flux was applied. They were reflowed, and then the surface thereof was washed and stayed at an environment of a temperature of 125° C. and humidity RH of 100% RH for 24 hours. Further, the solder balls (in the case of this example, a diameter thereof is 300 m) which were prepared by using the solder alloy consisting of, by mass %, 3.0% of Ag and 0.5% of Cu with the balance being Sn (Sn-3.0Ag-0.5Cu) were stayed at an environment of a temperature of 125° C. and humidity RH of 100% RH for 24 hours similarly to the small piece members. Next, flux was applied to samples made of the solder alloys of Examples or Comparative Examples, and the predetermined number of solder balls was put thereon. In the examples, the number of solder balls was set to be nine pieces and respective 5 plate materials were prepared. Then, after reflowing was performed, the number of fusion-failed solder balls was calculated and incidence of fusion defect was determined. The term fusion failure is defined as a state in which the small pieces and the solder balls are not bonded to each other.

When the number of the fusion failed solder balls is 0 or less, it was rated as "A"; when it was more than 0 and 10 or less, it was rated as "B"; and when it was more than 10, it was rated as "D".

(2) ΔT (K)

Each solder alloy as shown in Tables 1 and 2 was prepared, and the melting temperature of the solder was measured. The measurement of the solidus temperature was performed according to JIS Z3198-1. The liquidus temperature was measured, instead of JIS Z3198-1, with a method with DSC which is similar to the measurement method for a solidus temperature according to JIS Z3198-1. ΔT (K), which is the difference between the measured liquidus temperature and solidus temperature, was determined. When ΔT (K) was 100 K or less, it was rated as "B", and when it was over 100 K, it was rated as "D".

(3) Shear Strength

Solder balls with a diameter of 0.6 mm were prepared from solder alloy compositions as shown in Table 1. These solder balls were used for soldering to a substrate with a thickness of 1.2 mm and an electrode size of 0.5 mm in diameter (Cu—OSP).

As for the soldering conditions, a flux (manufactured by SENJU METAL INDUSTRY CO., LTD.: WF-6400) was applied onto an electrode, and soldering was performed using a reflow apparatus (manufactured by SENJU METAL INDUSTRY CO., LTD.: SNR-615) under a reflow profile with a peak temperature of 245° C. and a cooling rate of 2° C./s. The prepared sample was subjected to a shear strength test under the conditions of a shear rate of 1000 mm/s in a shear strength measuring device (manufactured by Nordson Dage: SERIES 4000HS).

(4) Ni Leaching

A preform with a thickness of 250 μm and made of alloy composition as shown in Table 1 was mounted on a Cu lead frame. Thereafter, an IC chip having a back metal on the side of a substrate bonded surface of a silicon chip of 5 mm×5 mm×200 μm' was mounted on the solder alloy. The back metal is obtained by sequentially stacking a 0.05 μm Ti layer as a barrier layer, and a 0.20 μm Ni layer. The mounting was performed in such an orientation that in the IC chip having the back metal, the Ni layer was in contact with the solder alloy. A substrate with the solder alloy and the IC chip mounted thereon was heated in a reflow furnace so that the peak temperature was 240° C., then die bonding was performed.

Then, a cross section of an obtained lead frame was zoomed up by a factor of 30000 on a SEM monitor, and an average value of a film thickness of an Ni layer was calculated from arbitrary 10 locations.

The results are shown in Tables 1 and 2.

TABLE 1

| | Alloy Composition (mass %) | | | | | | |
|---|---|---|---|---|---|---|---|
| | Sn | Ag | Cu | Ni | Ge | Bi | other |
| Example 1 | Bal. | 3.5 | 0.80 | 0.050 | 0.0040 | 0.20 | |
| Example 2 | Bal. | 3.5 | 0.80 | 0.060 | 0.0040 | 0.30 | |
| Example 3 | Bal. | 4.0 | 0.80 | 0.050 | 0.0030 | 4.00 | |
| Example 4 | Bal. | 3.0 | 0.80 | 0.020 | 0.0030 | 3.00 | |
| Example 5 | Bal. | 3.0 | 0.70 | 0.060 | 0.0035 | 0.50 | |
| Example 6 | Bal. | 3.2 | 0.50 | 0.050 | 0.0045 | 0.50 | |
| Example 7 | Bal. | 2.8 | 0.70 | 0.050 | 0.0045 | 1.00 | |
| Example 8 | Bal. | 3.5 | 0.80 | 0.050 | 0.0040 | 1.00 | |
| Example 9 | Bal. | 3.5 | 0.80 | 0.050 | 0.0040 | 1.50 | |
| Example 10 | Bal. | 1.0 | 0.70 | 0.040 | 0.0045 | 1.50 | |
| Reference Example 11 | Bal. | 1.0 | 0.50 | 0.068 | 0.0080 | 2.00 | |
| Example 12 | Bal. | 3.8 | 0.70 | 0.050 | 0.0040 | 2.00 | |
| Reference Example 13 | Bal. | 2.0 | 0.50 | 0.030 | 0.0080 | 1.40 | |
| Example 14 | Bal. | 0.5 | 0.80 | 0.010 | 0.0060 | 3.00 | |
| Example 15 | Bal. | 3.0 | 0.80 | 0.020 | 0.0040 | 3.00 | |
| Example 16 | Bal. | 3.2 | 0.75 | 0.040 | 0.0035 | 3.00 | |
| Reference Example 17 | Bal. | 4.0 | 0.50 | 0.050 | 0.0040 | 3.00 | |
| Example 18 | Bal. | 3.5 | 0.80 | 0.050 | 0.0030 | 4.00 | |
| Example 19 | Bal. | 2.0 | 0.60 | 0.030 | 0.0020 | 4.00 | |
| Example 20 | Bal. | 3.0 | 0.50 | 0.060 | 0.0030 | 4.00 | |
| Reference Example 21 | Bal. | 1.0 | 0.80 | 0.068 | 0.0045 | 5.00 | |
| Reference Example 22 | Bal | 3.4 | 0.50 | 0.030 | 0.0035 | 5.00 | |
| Reference Example 23 | Bal. | 2.0 | 0.75 | 0.070 | 0.0080 | 1.00 | |
| Reference Example 24 | Bal. | 2.0 | 0.75 | 0.070 | 0.0060 | 2.00 | |

TABLE 1-continued

| | Sn | Ag | Cu | Ni | Ge | Bi | other |
|---|---|---|---|---|---|---|---|
| Reference Example 25 | Bal. | 2.0 | 0.75 | 0.070 | 0.0050 | 3.00 | |
| Reference Example 26 | Bal. | 3.5 | 0.80 | 0.050 | 0.0045 | 2.00 | |
| Reference Example 27 | Bal. | 3.5 | 0.80 | 0.050 | 0.0045 | 2.50 | |
| Reference Example 28 | Bal. | 3.5 | 0.80 | 0.050 | 0.0040 | 3.00 | |
| Reference Example 29 | Bal. | 3.5 | 0.80 | 0.050 | 0.0040 | 3.50 | |
| Reference Example 30 | Bal. | 3.5 | 0.80 | 0.050 | 0.0050 | 1.50 | |
| Reference Example 31 | Bal. | 3.8 | 0.70 | 0.050 | 0.0040 | 3.00 | |
| Reference Example 32 | Bal. | 3.0 | 0.80 | 0.020 | 0.0045 | 3.00 | |
| Example 33 | Bal. | 3.5 | 0.80 | 0.050 | 0.0030 | 4.00 | Mn:0.01 |
| Example 34 | Bal. | 3.5 | 0.80 | 0.050 | 0.0030 | 4.00 | Pd:0.01 |
| Example 35 | Bal. | 3.5 | 0.80 | 0.050 | 0.0030 | 4.00 | P:0.01 |
| Example 36 | Bal. | 3.5 | 0.80 | 0.050 | 0.0030 | 4.00 | Au:0.01 |
| Example 37 | Bal. | 3.5 | 0.80 | 0.050 | 0.0030 | 4.00 | Pt:0.01 |
| Example 38 | Bal. | 3.5 | 0.80 | 0.050 | 0.0030 | 4.00 | Cr:0.01 |
| Example 39 | Bal. | 3.5 | 0.80 | 0.050 | 0.0030 | 4.00 | Fe:0.01 |
| Example 40 | Bal. | 3.5 | 0.80 | 0.050 | 0.0030 | 4.00 | Co:0.01 |
| Example 41 | Bal. | 3.5 | 0.80 | 0.050 | 0.0030 | 4.00 | V:0.01 |
| Example 42 | Bal. | 3.5 | 0.80 | 0.050 | 0.0030 | 4.00 | Mo:0.01 |
| Example 43 | Bal. | 3.5 | 0.80 | 0.050 | 0.0030 | 4.00 | Nb:0.01 |

| | Relation (1) | Relation (2) | Fusion failure | ΔT | Comprehensive evaluation |
|---|---|---|---|---|---|
| Example 1 | 0.018 | 3.8 | A | B | B |
| Example 2 | 0.019 | 4.5 | A | B | B |
| Example 3 | 0.027 | 3.6 | A | B | B |
| Example 4 | 0.020 | 1.4 | A | B | B |
| Example 5 | 0.015 | 4.0 | A | B | B |
| Example 6 | 0.019 | 2.3 | A | B | B |
| Example 7 | 0.020 | 3.3 | A | B | B |
| Example 8 | 0.021 | 3.7 | A | B | B |
| Example 9 | 0.023 | 3.7 | A | B | B |
| Example 10 | 0.015 | 2.7 | A | B | B |
| Reference Example 11 | 0.029 | 3.2 | B | B | B |
| Example 12 | 0.026 | 3.2 | A | B | B |
| Reference Example 13 | 0.031 | 1.4 | B | B | B |
| Example 14 | 0.026 | 0.7 | B | B | B |
| Example 15 | 0.027 | 1.4 | A | B | B |
| Example 16 | 0.024 | 2.7 | A | B | B |
| Reference Example 17 | 0.030 | 2.3 | A | B | B |
| Example 18 | 0.025 | 3.6 | A | B | B |
| Example 19 | 0.013 | 1.6 | A | B | B |
| Example 20 | 0.023 | 2.7 | A | B | B |
| Reference Example 21 | 0.031 | 5.0 | A | B | B |
| Reference Example 22 | 0.031 | 1.3 | A | B | B |
| Reference Example 23 | 0.031 | 5.0 | A | B | B |
| Reference Example 24 | 0.029 | 4.9 | A | B | B |
| Reference Example 25 | 0.029 | 4.9 | A | B | B |
| Reference Example 26 | 0.029 | 3.7 | A | B | B |
| Reference Example 27 | 0.031 | 3.7 | A | B | B |
| Reference Example 28 | 0.029 | 3.7 | A | B | B |
| Reference Example 29 | 0.031 | 3.6 | A | B | B |
| Reference Example 30 | 0.029 | 3.7 | A | B | B |
| Reference Example 31 | 0.030 | 3.2 | A | B | B |
| Reference Example 32 | 0.031 | 1.4 | A | B | B |
| Example 33 | 0.025 | 3.6 | A | B | B |
| Example 34 | 0.025 | 3.6 | A | B | B |
| Example 35 | 0.025 | 3.6 | A | B | B |
| Example 36 | 0.025 | 3.6 | A | B | B |
| Example 37 | 0.025 | 3.6 | A | B | B |
| Example 38 | 0.025 | 3.6 | A | B | B |
| Example 39 | 0.025 | 3.6 | A | B | B |
| Example 40 | 0.025 | 3.6 | A | B | B |
| Example 41 | 0.025 | 3.6 | A | B | B |
| Example 42 | 0.025 | 3.6 | A | B | B |
| Example 43 | 0.025 | 3.6 | A | B | B |

TABLE 2

| | Alloy Composition (mass %) | | | | | | |
|---|---|---|---|---|---|---|---|
| | Sn | Ag | Cu | Ni | Ge | Bi | other |
| Comparative Example 1 | Bal. | 3.0 | 0.50 | 0.030 | 0.0150 | | |
| Comparative Example 2 | Bal. | 3.8 | 0.60 | 0.120 | 0.0060 | 4.00 | |
| Comparative Example 3 | Bal. | 4.0 | 0.75 | 0.150 | 0.0300 | 5.00 | |
| Comparative Example 4 | Bal. | 3.0 | 0.70 | 0.050 | 0.0060 | 1.50 | |
| Comparative Example 5 | Bal. | 1.0 | 0.70 | 0.015 | 0.0000 | 4.00 | |
| Comparative Example 6 | Bal. | 3.0 | 0.50 | 0.060 | 0.0050 | 3.00 | |
| Comparative Example 7 | Bal. | 3.5 | 0.50 | 0.100 | 0.1500 | | |
| Comparative Example 8 | Bal. | 2.0 | 0.50 | 0.100 | 0.0500 | 2.00 | |
| Comparative Example 9 | Bal. | 3.5 | 0.50 | 0.100 | 0.0500 | | |
| Comparative Example 10 | Bal. | 4.5 | 0.85 | 0.005 | 0.0005 | 2.00 | |
| Comparative Example 11 | Bal. | 0.1 | 0.20 | 0.050 | 0.0005 | 2.00 | |

| | Relation (1) | Relation (2) | Fusion failure | ΔT | Comprehensive evaluation |
|---|---|---|---|---|---|
| Comparative Example 1 | 0.053 | 1.4 | D | B | D |
| Comparative Example 2 | 0.051 | 6.5 | | | |
| Comparative Example 3 | 0.297 | 10.1 | D | D | D |
| Comparative Example 4 | 0.032 | 3.3 | D | B | D |
| Comparative Example 5 | 0.000 | 0.9 | D | B | D |
| Comparative Example 6 | 0.033 | 2.8 | D | B | D |
| Comparative Example 7 | 0.615 | 4.7 | D | B | D |
| Comparative Example 8 | 0.230 | 4.7 | D | B | D |
| Comparative Example 9 | 0.205 | 4.7 | D | B | D |
| Comparative Example 10 | 0.004 | 0.3 | D | B | D |
| Comparative Example 11 | 0.001 | 0.9 | D | B | D |

The underline indicates that it does not fall within the scope of the present invention.

As shown in Table 1, according to Examples 1 to 43 (excluding Reference Examples 11, 13, 17, and 21 to 32), it was revealed that fusion failure does not occur and ΔT is in a predetermined range because the content of each constituent element and the relations (1) and (2) were satisfied for all the alloy compositions. In addition, it was confirmed that the solder joints obtained using the solder alloys of Examples showed higher values of shear strength than any of Comparative Examples. Further, it was confirmed that Ni leaching was also suppressed.

On the other hand, according to Comparative Examples 1 to 11, the relation (1) was not satisfied, whereby many fusion-failed solder balls were detected. In addition, the Sn-2.0Ag-0.75Cu-0.070Ni-0.0080Ge solder alloy (the numerical values are expressed in mass %; the balance is Sn and unavoidable impurities) had inferior shear strength of solder joints because they satisfied the relation (1) but not relation (2).

The invention claimed is:

1. A lead-free and antimony-free solder alloy consisting of, by mass %,
   0.1 to 4.5% of Ag,
   0.20 to 0.85% of Cu,
   0.2 to 5.00% of Bi,
   0.005 to 0.09% of Ni,
   0.0005 to 0.0045% of Ge, and
   optionally one or more selected from the group consisting of Mn, Pd, Au, Pt, Cr, Fe, Co, V, Mo, and Nb each with an upper limit of 0.01% by mass %, and with the balance being Sn,
   wherein the lead-free and antimony-free solder alloy satisfies the following relations (1) and (2):

$0.013 \leq (Ag+Cu+Ni+Bi) \times Ge \leq 0.027$     relation (1)

$Sn \times Cu \times Ni \leq 5.0$     relation (2)

wherein Ag, Cu, Ni, Bi, Ge, and Sn in the relations (1) and (2) each represent the contents (mass %) thereof in the alloy composition.

2. A solder ball comprising the lead-free and antimony-free solder alloy according to claim 1.

3. The solder ball according to claim 2, having an average particle diameter of 1 to 1000 μm.

4. The solder ball according to claim 2, having a sphericity of 0.95 or more.

5. The solder ball according to claim 2, having a sphericity of 0.99 or more.

6. A ball grid array formed using the solder ball according to claim 2.

7. A solder joint comprising the lead-free and antimony-free solder alloy according to claim 1.

8. The lead-free and antimony-free solder alloy according to claim 1, wherein the lead-free and antimony-free solder alloy satisfies the following relation (2):

$0.7 \leq Sn \times Cu \times Ni \leq 5.0$     relation (2)

wherein Cu, Ni, and Sn in the relation (2) each represent the contents (mass %) thereof in the alloy composition.

9. The lead-free and antimony-free solder alloy according to claim 1, wherein $\Delta T$ is 100K or less.

10. The lead-free and antimony-free solder alloy according to claim 1, wherein the Ge content is 0.0005 to 0.0040%.

* * * * *